United States Patent
Liu et al.

(10) Patent No.: US 12,477,760 B2
(45) Date of Patent: Nov. 18, 2025

(54) SEMICONDUCTOR STRUCTURE AND MANUFACTURING METHOD THEREOF

(71) Applicant: Enkris Semiconductor (Wuxi), Ltd., Wuxi (CN)

(72) Inventors: Weihua Liu, Wuxi (CN); Kai Cheng, Wuxi (CN)

(73) Assignee: Enkris Semiconductor (Wuxi), Ltd., Wuxi (CN)

( * ) Notice: Subject to any disclaimer, the term of this patent is extended or adjusted under 35 U.S.C. 154(b) by 374 days.

(21) Appl. No.: 18/356,215

(22) Filed: Jul. 20, 2023

(65) Prior Publication Data

US 2024/0178326 A1     May 30, 2024

(30) Foreign Application Priority Data

Nov. 24, 2022   (CN) .......................... 202211485604.0

(51) Int. Cl.
| H10D 8/50 | (2025.01) |
| H10H 20/01 | (2025.01) |
| H10H 20/812 | (2025.01) |
| H10H 20/825 | (2025.01) |

(52) U.S. Cl.
CPC ........ H10D 8/50 (2025.01); H10H 20/01335 (2025.01); H10H 20/812 (2025.01); H10H 20/8252 (2025.01)

(58) Field of Classification Search
None
See application file for complete search history.

(56) References Cited

U.S. PATENT DOCUMENTS

| | | | | |
|---|---|---|---|---|
| 2007/0246736 A1* | 10/2007 | Senda | .................. | H10H 20/812 257/103 |
| 2008/0315178 A1* | 12/2008 | Kim | ...................... | H10H 20/81 257/13 |
| 2013/0062612 A1* | 3/2013 | Shioda | ................. | H10H 20/815 257/E29.089 |
| 2014/0327013 A1* | 11/2014 | Schenk | ................. | C30B 29/406 117/90 |
| 2016/0027962 A1* | 1/2016 | Liao | ...................... | H10H 20/824 438/47 |
| 2016/0079471 A1* | 3/2016 | Liao | ...................... | H10H 20/811 438/47 |
| 2016/0118539 A1* | 4/2016 | Sugiyama | ............ | H10H 20/815 438/39 |
| 2018/0287015 A1* | 10/2018 | Wang | ................. | H10H 20/8215 |

* cited by examiner

*Primary Examiner* — Bilkis Jahan
(74) *Attorney, Agent, or Firm* — Christopher R. Carroll; The Small Patent Law Group LLC

(57) ABSTRACT

A semiconductor structure and a manufacturing method of the semiconductor structure are provided. The semiconductor structure includes an n-type semiconductor layer, a functional layer, a p-type semiconductor layer, a first AlN layer and a first heavily doped n-type semiconductor layer arranged in sequence. The first AlN layer is provided to reduce the diffusion of p-type ions from the p-type semiconductor layer into the first heavily doped n-type semiconductor layer, to avoid a thicker tunneling junction caused by n-type ions/p-type ions co-doping, to improve the tunneling effect of carriers, to enhance the uniformity of the current density distribution of the first heavily doped n-type semiconductor layer injected into the p-type semiconductor layer, to solve the problem that the p-type semiconductor layer has low carrier mobility and high resistivity.

14 Claims, 5 Drawing Sheets

SEMICONDUCTOR STRUCTURE AND MANUFACTURING METHOD THEREOF

CROSS REFERENCE TO RELATED APPLICATIONS

This application claims priority to Chinese Patent Application No. 202211485604.0 filed on Nov. 24, 2022, the entire content of which is incorporated herein by reference.

TECHNICAL FIELD

This present disclosure relates to the field of semiconductor, and more particular, to a semiconductor structure and a manufacturing method thereof.

BACKGROUND

In recent years, light emitting diodes (LEDs) in semiconductor devices, is a new generation of green light sources. LEDs have been widely used in fields such as lighting, backlight, display, and indication. The LED includes an n-type semiconductor layer, a light-emitting layer, and a p-type semiconductor layer arranged in layers. Gallium nitride as the representative of the Group III nitride, is a wide band gap semiconductor material with direct band gap, which has excellent properties such as high electron drift saturation speed, good thermal conductivity, strong chemical bond, high temperature resistance and corrosion resistance, and is widely used to manufacture LEDs.

Using p-type GaN semiconductor materials to produce p-type semiconductor layers is achieved by doping p-type dopants into GaN semiconductor materials. In order to effectively activate GaN materials to obtain p-type GaN semiconductor materials, magnesium is generally chosen as the p-type dopant in this field. However, most of the holes formed by replacing gallium with magnesium have deep energy levels, and magnesium and hydrogen in the epitaxial process tend to form the magnesium-hydrogen bond so that there are no enough hole carriers to be provided effectively (even if the magnesium-hydrogen bond can be broken by annealing in the sequent process, the probability of breaking is only about 2%). Therefore, p-type semiconductor materials have problems of low carrier mobility and high resistivity.

SUMMARY

In view of this, a semiconductor structure and a manufacturing method of the semiconductor structure are provided in this present disclosure.

According to an aspect of the present application, a semiconductor structure is provided in an embodiment of the present disclosure. The semiconductor structure includes an n-type semiconductor layer, a functional layer, and a p-type semiconductor layer arranged in sequence; a first AlN layer, where the first AlN layer is located on a side of the p-type semiconductor layer away from the functional layer; and a first heavily doped n-type semiconductor layer, where the first heavily doped n-type semiconductor layer is located on a side of the first AlN layer away from the p-type semiconductor layer.

In an embodiment, the semiconductor structure includes a light-emitting device, and the functional layer includes an active layer; or, the semiconductor structure includes a PIN diode, and the functional layer includes an intrinsic layer.

In an embodiment, a thickness of the first AlN layer is less than or equal to 5 nm in a direction from the n-type semiconductor layer pointing towards the functional layer.

In an embodiment, a material of the first AlN layer is in an undoped, n-type doped, or p-type doped state.

In an embodiment, the first AlN layer is doped with any one of scandium, indium, or aluminum.

In an embodiment, the semiconductor structure further includes a heavily doped p-type semiconductor layer; where, the heavily doped p-type semiconductor layer is located between the p-type semiconductor layer and the first AlN layer, and the doping concentration of the heavily doped p-type semiconductor layer is higher than the doping concentration of the p-type semiconductor layer.

In an embodiment, a side wall of the p-type semiconductor layer is sequentially covered with a second AlN layer and a second heavily doped n-type semiconductor layer.

In an embodiment, a thickness of the second AlN layer is less than or equal to 5 nm in a direction parallel to the plane where the functional layer is located.

In an embodiment, a material of the first heavily doped n-type semiconductor layer includes In element.

In an embodiment, the p-type semiconductor layer includes a second p-type semiconductor layer, where the p-type semiconductor layer is located on a side wall of the functional layer.

According to an aspect of the present application, in embodiment of the present application, a manufacturing method of a semiconductor structure is provided. The method includes: forming an n-type semiconductor layer; forming a functional layer on a side of the n-type semiconductor layer; forming a p-type semiconductor layer on a side of the functional layer away from the n-type semiconductor layer; forming a first AlN layer on a side of the p-type semiconductor layer away from the functional layer; forming a first heavily doped n-type semiconductor layer is on a side of the first AlN layer away from the p-type semiconductor layer.

In an embodiment, after forming the p-type semiconductor layer on the side of the functional layer away from the n-type semiconductor layer, the method further includes: removing a part of the p-type semiconductor layer and a part the functional layer to make the side walls of the p-type semiconductor layer and the functional layer at a same line; forming the first AlN layer on a side of the p-type semiconductor layer away from the functional layer, and forming a second AlN layer on a side wall of the p-type semiconductor layer, wherein the first AlN layer and the second AlN layer are formed simultaneously; forming the first heavily doped n-type semiconductor layer on a side of the first AlN layer away from the p-type semiconductor layer, and forming a second heavily doped n-type semiconductor layer on a side of the second AlN layer away from the functional layer, wherein the first heavily doped n-type semiconductor layer and the second heavily doped n-type semiconductor layer are formed simultaneously.

A semiconductor structure and a manufacturing method of the semiconductor structure are provided this present disclosure. The semiconductor structure includes: an n-type semiconductor layer, a functional layer, a p-type semiconductor layer, a first AlN layer and a first heavily doped n-type semiconductor layer arranged in sequence. The first heavily doped n-type semiconductor layer allows carriers to be transported by the energy level tunneling effect, improving the contact resistance of the p-type semiconductor layer and improving the current diffusion. The first AlN layer is provided to reduce the diffusion of p-type ions from the p-type semiconductor layer into the first heavily doped n-type semiconductor layer, to avoid a thicker tunneling junction caused by n-type ions/p-type ions co-doping, to improve the tunneling effect of carriers, to enhance the uniformity of the current density distribution of the first heavily doped n-type semiconductor layer injected into the p-type semiconductor layer, to solve the problem that the p-type semiconductor layer has low carrier mobility and high resistivity, and to improve the semiconductor properties.

DETAILED DESCRIPTION

Exemplary embodiments of the present disclosure will be described in detail below with reference to the accompanying drawings. The terms used in this present disclosure are for the purpose of describing particular embodiments only and are not intended to limit this present disclosure. The singular forms of "a/an", "said", and "the" used in this application and the appended claims are also intended to include the plural forms, unless the context clearly indicates otherwise. It should also be appreciated that the term "and/or" used in herein refers to and includes any or all possible combinations of one or more related listed items.

Figure 1:
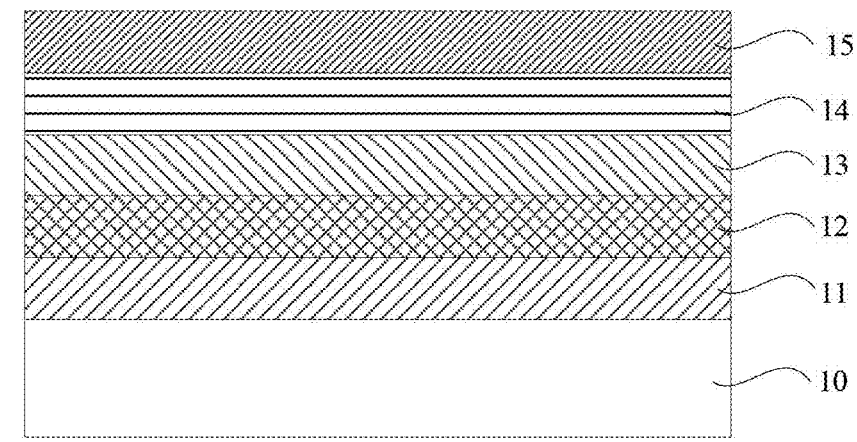
FIG. 1 is a cross-sectional structure schematic diagram of a semiconductor structure according to an embodiment of the present disclosure.

In view of this, according to an embodiment of the present disclosure, a semiconductor structure is provided. As shown in FIG. 1, FIG. 1 is a cross-sectional structure schematic diagram of a semiconductor structure according to an embodiment of the present disclosure. The semiconductor structure includes: an n-type semiconductor layer 11, a functional layer 12, and a p-type semiconductor layer 13 arranged in sequence; a first AlN layer 14, which is located on a side of the p-type semiconductor layer 13 away from the functional layer 12; and a heavily doped first n-type semiconductor layer 15, which is located on a side of the first AlN layer 14 away from the p-type semiconductor layer 13.

Figure 2:
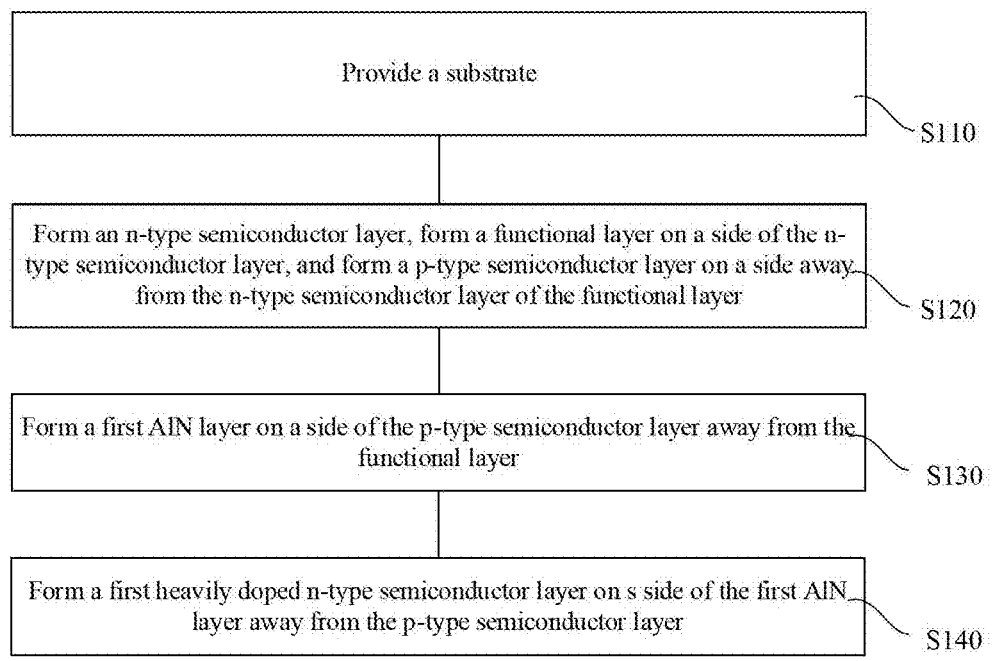
FIG. 2 is a flowchart of a method of manufacturing a semiconductor structure according to an embodiment of the present disclosure.

FIG. 2 is a flowchart of a manufacturing method of a semiconductor structure according to an embodiment of the present disclosure. According to an embodiment of the present disclosure, a manufacturing method of a semiconductor structure is provided. As shown in FIGS. 1 and 2, the method includes: in step S120, an n-type semiconductor layer 11 is formed; a functional layer 12 is formed on a side of the n-type semiconductor layer 11, and a p-type semiconductor layer 13 is formed on a side of the functional layer 12 away from the n-type semiconductor layer 11; in step S130, a first AlN layer 14 is formed on a side of the p-type semiconductor layer 13 away from the functional layer 12; in step S140, a first heavily doped n-type semiconductor layer 15 is formed on a side of the first AlN layer 14 away from the p-type semiconductor layer 13.

In some embodiments, the semiconductor structure can include LED, LD (Laser Diode), PIN diode, etc. Specifically, the semiconductor structure can be an LED, for example, the functional layer 12 includes the active layer. The n-type semiconductor layer 11, the functional layer 12 and the p-type semiconductor layer 13 form the LED structure. The electrons provided by the n-type semiconductor layer 11 and the holes provided by the p-type semiconductor layer 13 recombine in the functional layer 12 to generate photons, and therefore the LED structure can emit light. Due to the low activation efficiency of the p-type semiconductor layer 13, the carrier mobility is low and the resistivity is high, resulting in an increase in the contact resistance between the metal electrode and the p-type semiconductor layer 13. In addition, the low carrier mobility of p-type semiconductor layer 13 leads to serious uneven current density distribution during the operation, which also affects the uniformity and brightness of the light. Therefore, the first heavily doped n-type semiconductor layer 15 is provided on a side of the p-type semiconductor layer 13 away from the functional layer 12, which allows carriers to be transported by the energy level tunneling effect, thereby improving the contact resistance between the metal electrode and the p-type semiconductor layer 13. Furthermore, the first heavily doped n-type semiconductor layer 15 has a higher current expansion capacity than the p-type semiconductor layer 13, which facilitates current diffusion. In some embodiments, if the semiconductor structure includes PIN, the functional layer 12 includes the intrinsic layer.

When making the first heavily doped n-type semiconductor layer 15, the p-type ions in the p-type semiconductor layer 13 tend to diffuse into the first heavily doped n-type semiconductor layer 15, resulting in a state of n-type ion/p-type ion co-doping on the surface of the first heavily doped n-type semiconductor layer 15 close to the functional layer 12, leading to a thicker and weaker tunneling junction, which blocks the carriers tunneling capability. To solve this problem, further, the first AlN layer 14 is provided between the p-type semiconductor layer 13 and the first heavily doped n-type semiconductor layer 15, which can reduce the diffusion of p-type ions in the p-type semiconductor layer 13 into the first heavily doped n-type semiconductor layer 15, avoid a thicker tunneling junction caused by the co-doping of n-type ions/p-type ions, and improve the tunneling effect of carriers. The first AlN layer 14 improves the uniformity of the current density distribution of the first heavily doped n-type semiconductor layer 15 injected into the p-type semiconductor layer 13, solves the problems of low carrier mobility and high resistivity of the p-type semiconductor layer 13, and improves the semiconductor characteristics.

In some embodiments, materials for the n-type semiconductor layer 11, functional layer 12 and p-type semiconductor layer 13 include GaN-based materials, and forming process for the layers may include: Atomic Layer Deposition (ALD), or Chemical Vapor Deposition (CVD), or molecular beam epitaxial (MBE), or Plasma Enhanced Chemical Vapor Deposition (PECVD), or Low Pressure Chemical Vapor Deposition (LPCVD), or Metal-Organic Chemical Vapor Deposition (MOCVD), or a combination thereof.

In an embodiment of the present disclosure, as shown in FIG. 1, the semiconductor structure further includes a substrate 10, which can be a growth substrate and is located on the side of the n-type semiconductor layer 11 away from the functional layer 12. Referring to step S110 in FIG. 2, a substrate 10 is provided; steps S120 to S140, an n-type semiconductor layer 11, a functional layer 12, a p-type semiconductor layer 13, a first AlN layer 14, and a first heavily doped n-type semiconductor layer 15 are sequentially formed on the substrate 10. In the embodiment of the present disclosure, the material of the substrate 10 can include at least one of sapphire, silicon, silicon carbide, GaN-based material, or diamond. In some embodiments, the semiconductor structure of the present disclosure can be provided upside down on a supporting substrate to form an inverted semiconductor structure (not shown in figures).

It should be noted that in the embodiment of this present disclosure, chemical elements are used to represent a material, but the molar proportions of each chemical element in the material are not limited. For example, in GaN materials, both Ga and N elements are included, but the molar ratio of Ga and N elements is not limited.

In an embodiment of the present disclosure, the doping process of n-type semiconductor layer 11 and p-type semiconductor layer 13 can be growing and doping at the same time (i.e. in-situ doping). Or after the semiconductor layer with the corresponding material is obtained, the ion implantation can be performed. In some embodiments, the p-type ions of the p-type semiconductor layer 13 include at least one kind of Mg, Zn, Ca, Sr, Ba, or C ions. The n-type ions in the n-type semiconductor layer 11 can include at least one kind of Si, Ge, Sn, Se, or Te ions.

For example, the p-type ions in p-type semiconductor layer 13 are Mg ions, but Mg ions are easy to form Mg—H bonds with H during the epitaxial process. The probability of breaking the Mg—H bond by annealing is only 2%. Therefore, the activation efficiency is low and hole carriers cannot be effectively provided. The first heavily doped n-type semiconductor layer 15 is provided on the side of the p-type semiconductor layer 13 away from the functional layer 12, enabling carrier be transported under the potential field by energy level tunneling effect. During the epitaxial process, the Mg ions of the p-type semiconductor layer 13 are more active and easily diffuse into the first heavily doped n-type semiconductor layer 15. If the n-type ion of the first heavily doped n-type semiconductor layer 15 is Si, a Si/Mg co-doped state is formed on the surface of the first heavily doped n-type semiconductor layer 15 close to the functional layer 12, and the tunneling junction becomes thicker and weaker, which blocks the carriers tunneling capability. To solve this problem, further, the first AlN layer 14 is provided between the p-type semiconductor layer 13 and the first heavily doped n-type semiconductor layer 15, which can reduce the diffusion of Mg ions in the p-type semiconductor layer 13 into the first heavily doped n-type semiconductor layer 15, avoid a thicker tunneling junction caused by the co-doping of Si ions/Mg ions, improve the tunneling effect of carriers, solve the problems of low carrier mobility and high resistivity of the p-type semiconductor layer 13, and improve the semiconductor characteristics.

In an embodiment of the present disclosure, when the semiconductor structure includes an LED, the functional layer 12 includes an active layer. The functional layer 12 can be at least one of a single quantum well structure, a multiple quantum well (MQW) structure, a quantum wire structure, or a quantum dot structure.

In an embodiment of the present disclosure, before forming an n-type semiconductor layer 11 on the substrate 10, a nucleation layer and a buffer layer (not shown in figures) can be formed sequentially. The material of the nucleation layer can include, for example, AlN, and the buffer layer can include at least one of AlN, GaN, AlGaN, or AlInGaN. The formation method of the buffer layer can be the same as that of the n-type semiconductor layer 11. In some embodiments, the buffer layer can include an intrinsic semiconductor layer, for example, μGaN or μAlInGaN. In some embodiments, a stress relief layer (not shown in figures) is formed between the n-type semiconductor layer 11 and the functional layer 12 to alleviate the problems of lattice mismatch and thermal mismatch between the semiconductor film layers and the substrate, and improve crystal quality.

Figure 3:
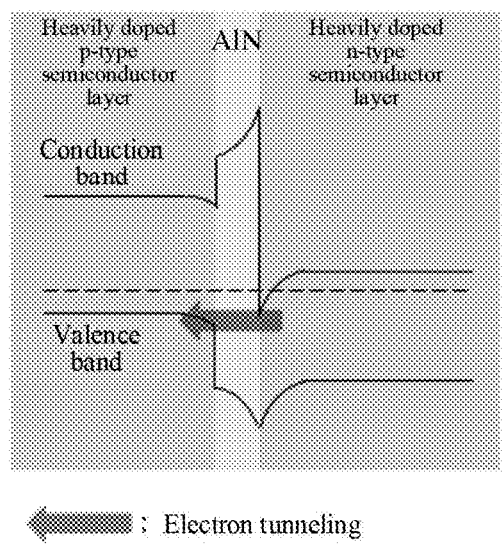
FIG. 3 is a schematic diagram of tunneling effect according to an embodiment of the present disclosure.

In an embodiment of the present disclosure, as shown in FIG. 1, in order to improve the tunneling effect, the thickness of the first AlN layer 14 is less than or equal to 5 nm in the direction from the n-type semiconductor layer 11 pointing towards the functional layer 12 (also known as a first direction Y). The tunneling effect, also known as interband tunneling, refers to the electrons traveling from the conduction band of an n-type semiconductor layer, through the first AlN layer 14 and finally reaching the valence band of the p-type semiconductor layer. At the same time, holes are generated in the p-type semiconductor layer and transported in the valence band. Since the energy gap of AlN (6.2 eV) is wider than that of GaN (3.4 eV), and combined with FIG. 3, which is a schematic diagram of the tunneling effect shown in an embodiment of the present disclosure, under the effect of an electric field, the band bending of AlN is more obvious, resulting in a lower electric potential barrier when the carrier passes through the tunneling structure, thus the forward driving voltage in the operating state of the semiconductor structure obtained by the manufacturing method in FIG. 2 can be reduced effectively. In the embodiment of the present disclosure, the thickness of the first AlN layer 14 is relatively thin, which does not affect the tunneling effect and can achieve efficient transport of carriers.

In an embodiment of the present disclosure, a material of the first AlN layer 14 is in an undoped, n-type doped, or p-type doped state.

Specifically, the material of the first AlN layer 14 is not doped. In this way, manufacturing process is simple, and the diffusion of p-type ions in the p-type semiconductor layer 13 into the first heavily doped n-type semiconductor layer 15 can be effectively reduced, avoiding a thicker interface caused by n-type ions/p-type ions co-doping, and improving the tunneling ability of carriers.

In an embodiment of the present disclosure, the manufacturing process of the first AlN layer 14 can refer to the manufacturing processes of the n-type semiconductor layer 11, the functional layer 12, and the p-type semiconductor layer 13, and will not be repeated herein.

In an embodiment of the present disclosure, the first AlN layer 14 can be doped with scandium. Specifically, the first AlN layer 14 is formed into alloy AlScN or ScN. The first AlN layer 14 doped with scandium exhibits high piezoelectric properties, and the built-in stress causes more carriers to cluster in an interface between the p-type semiconductor layer 13 and the first AlN layer 14, solving the problem of low carrier mobility in the p-type semiconductor layer 13.

In an embodiment of the present disclosure, the first AlN layer 14 can be doped with indium or aluminum. Specifically, indium or aluminum accounts for over 70% of the metal atoms in the first AlN layer 14.

In an embodiment of the present disclosure, the manufacturing process of the first heavily doped n-type layer 15 can refer to the manufacturing processes of the n-type semiconductor layer 11, the functional layer 12, and the p-type semiconductor layer 13, and will not be repeated herein. The material of the first heavily doped n-type semiconductor layer 15 includes In elements. In some embodiments, the material of the first heavily doped n-type semiconductor layer 15 can includes InGaN, which has better ohmic contact with ITO (indium tin oxide) materials and metal electrode materials in subsequent manufacturing processes of chip. The doping ions in the first heavily doped n-type semiconductor layer 15 include at least one kind of Si ions, Ge ions, Sn ions, Se ions, or Te ions. The doping concentration of the first heavily doped n-type semiconductor layer 15 can be greater than or equal to $1E18/cm^3$.

Figure 4:
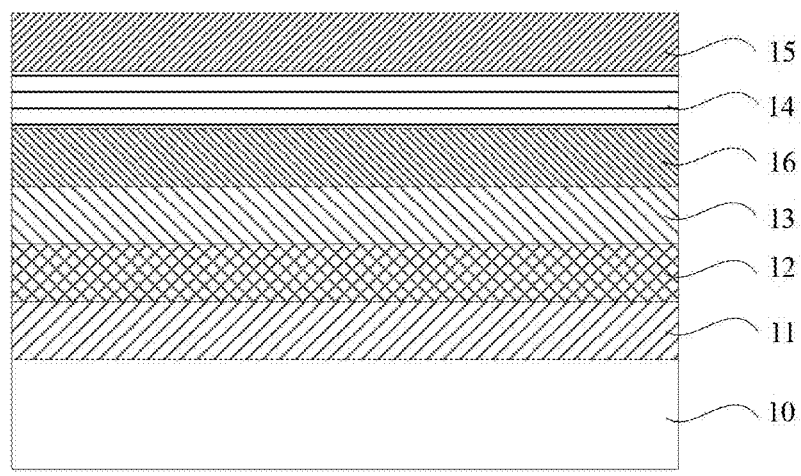
FIG. 4 is a cross-sectional structure schematic diagram of a semiconductor structure according to an embodiment of the present disclosure.

FIG. 4 is a cross-sectional structure schematic diagram of a semiconductor structure according to an embodiment of the present disclosure. Compared with the semiconductor structure shown in FIG. 1, the semiconductor structure shown in FIG. 4 further includes a heavily doped p-type semiconductor layer 16 located between the p-type semiconductor layer 13 and the first AlN layer 14. The doping concentration of heavily doped p-type semiconductor layer 16 is higher than that of p-type semiconductor layer 13. A higher hole concentration can reduce the contact resistance between a side of p-type semiconductor layer 13 and the metal electrode. In some embodiments, the doping concentration of the heavily doped p-type semiconductor layer 16 can be greater than or equal to $1E19/cm^3$.

In an embodiment of the present disclosure, the materials for the heavily doped p-type layer 16 can include GaN-based materials. The manufacturing process of the heavily doped p-type layer 16 can refer to the manufacturing processes of the n-type semiconductor layer 11, the functional layer 12, and the p-type semiconductor layer 13, and will not be repeated herein. In some embodiments, the p-type ions in the heavily doped p-type semiconductor layer 16 include Mg ions.

Figure 5:
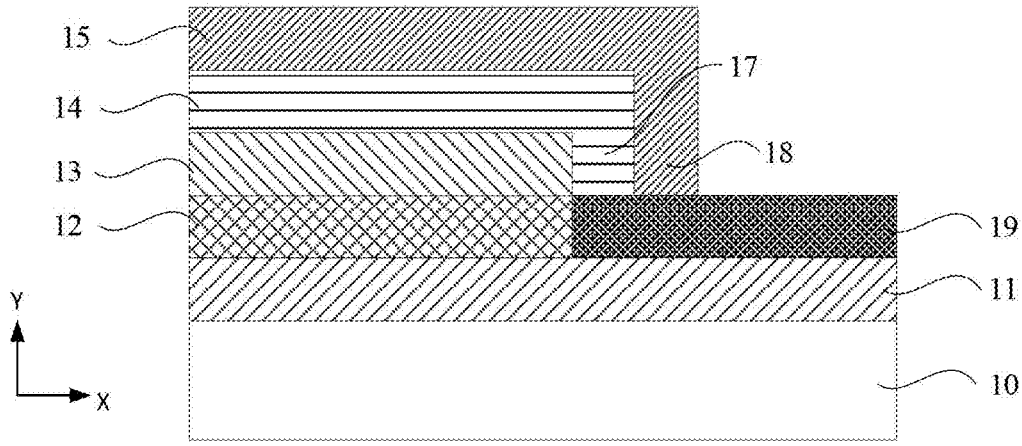
FIG. 5 is a cross-sectional structure schematic diagram of a semiconductor structure according to an embodiment of the present disclosure.
Figure 6:
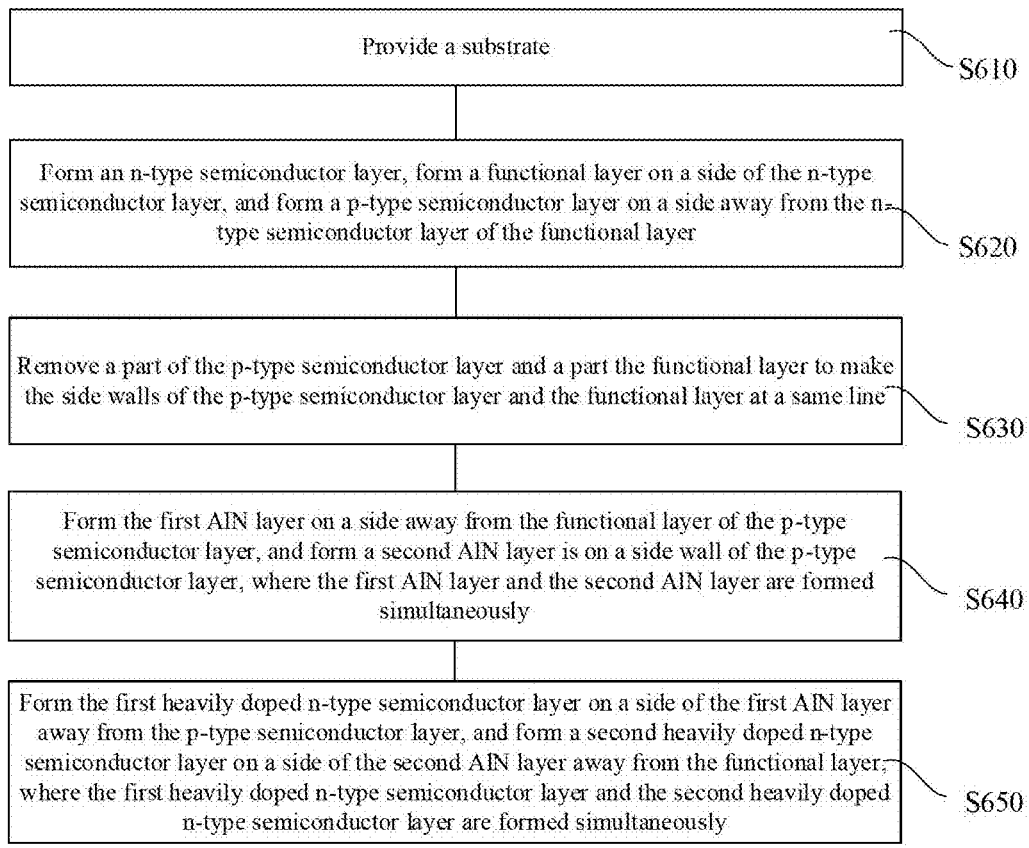
FIG. 6 is a flowchart of a method of manufacturing the semiconductor structure of FIG. 5.

FIG. 5 is a cross-sectional structure schematic diagram of the semiconductor structure according to an embodiment of the present application. FIG. 6 is a flowchart of the manufacturing method of the semiconductor structure in FIG. 5. The semiconductor structure shown in FIG. 5 is different from that shown in FIGS. 1 and 4. Specifically, a side wall of the p-type semiconductor layer 13 in FIG. 5 are sequentially covered with a second AlN layer 17 and a second heavily doped n-type semiconductor layer 18.

Firstly, referring to step S610 in FIG. 6, a substrate 10 is provided.

Next, referring to step S620 in FIG. 6, an n-type semiconductor layer 11 is formed on the substrate 10, a functional layer 12 is formed on a side of the n-type semiconductor layer 11 away from the substrate 10, and a p-type semiconductor layer 13 is formed on a side of the functional layer 12 away from the n-type semiconductor layer 11.

Next, referring to step S630 in FIG. 6, a part of the p-type semiconductor layer 13 and a part of functional layer 12 are remove to make the side walls of the p-type semiconductor layer 13 and functional layer 12 at the same line. In some embodiments, the p-type semiconductor layer 13 and the functional layer 12 can be dry etched to make the side walls of the p-type semiconductor layer 13 and the functional layer 12 at the same line. Dry etching gas can be $CF_4$, $C_3F_3$, etc.

Figure 7:
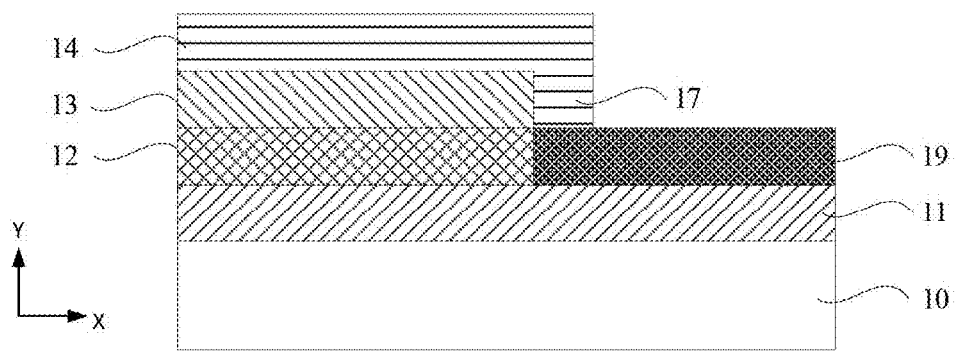
FIG. 7 is a schematic view illustrating an intermediate structure corresponding to the process of FIG. 6.

Next, referring to step S640 in FIG. 6, a first AlN layer 14 is formed on a side of the p-type semiconductor layer 13 away from the functional layer 12, and a second AlN layer 17 is formed on a side wall of the p-type semiconductor layer 13. The first AlN layer 14 and the second AlN layer 17 can be formed simultaneously. It should be noted that simultaneous formation means that it can be made in one step. The thickness of the second AlN layer 17 is less than or equal to 5 nm in the direction parallel to the plane where the functional layer 12 is located (also known as a second direction X). In some embodiments, FIG. 7 is a schematic view illustrating an intermediate structure corresponding to the process of FIG. 6. As shown in FIG. 7, an AlN layer is formed on the exposed surface of the p-type semiconductor layer 13. The exposed surface of the p-type semiconductor layer 13 can be a surface of the p-type semiconductor layer 13 away from the functional layer 12 and a side wall of the p-type semiconductor layer 13. In other words, the first AlN layer 14 and the second AlN layer 17 can be formed simultaneously.

In some embodiments, before forming the first AlN layer 14 and the second AlN layer 17, a passivation layer 19 is formed on a side wall of the functional layer 12 and a surface of the n-type semiconductor layer 11 away from the substrate 10. The passivation layer 19 is used to isolate the second AlN layer 17 from the n-type semiconductor layer 11 and to protect the n-type semiconductor layer 11. In some embodiments, the passivation layer 19 includes undoped GaN-based materials. In step S640 of epitaxial growth for AlN, the AlN layer may be epitaxially grwon on the surface of the passivation layer 19 away from the substrate 10 at the same time. At this time, it is necessary to add an etching step to remove the AlN layer on the passivation layer 19. In some embodiments, the passivation layer 19 includes $SiO_2$ material. In this case, in step S640, an AlN layer is not formed on the surface of the passivation layer 19 away from the substrate 10, therefore there is no additional etching step.

Then, referring to step S650 in FIG. 6, a first heavily doped n-type semiconductor layer 15 is formed on a side of the first AlN layer 14 away from the p-type semiconductor layer 13, and a second heavily doped n-type semiconductor layer 18 is formed on a side of the second AlN layer 17 away from the functional layer 12. The first heavily doped n-type semiconductor layer 15 and the second heavily doped n-type semiconductor layer 18 can be formed simultaneously. In some embodiments, combined with FIG. 5, a first heavily doped n-type semiconductor layer 15 and a second heavily doped n-type semiconductor layer 18 are formed on the exposed surface of the first AlN layer 14 and the exposed surface of the second AlN layer 17, respectively. In this way, the first heavily doped n-type semiconductor layer 15 and the second heavily doped n-type semiconductor layer 18 can be obtained at the same time.

Regarding the repetitive content in FIG. 6 and FIG. 2, please refer to the relevant expressions in FIG. 2 and will not be repeated herein.

In the semiconductor structure shown in FIG. 5, a side wall of the p-type semiconductor layer 13 is sequentially covered with a second AlN layer 17 and a second heavily doped n-type semiconductor layer 18. The p-type semiconductor layer 13 and the second heavily doped n-type semiconductor layer 18 can form a tunneling junction, and the carriers can transit between the second heavily doped n-type semiconductor layer 18 and the p-type semiconductor layer 13, improving the tunneling effect of the carriers and thus improving the semiconductor characteristics.

In an embodiment of the present disclosure, the formation processes of the first AlN layer 14 and the second AlN layer 17, as well as the formation processes of the first heavily doped n-type layer 15 and the second heavily doped n-type semiconductor layer 18, can refer to the corresponding structures in FIG. 5 and will not be repeated herein.

Figure 8:
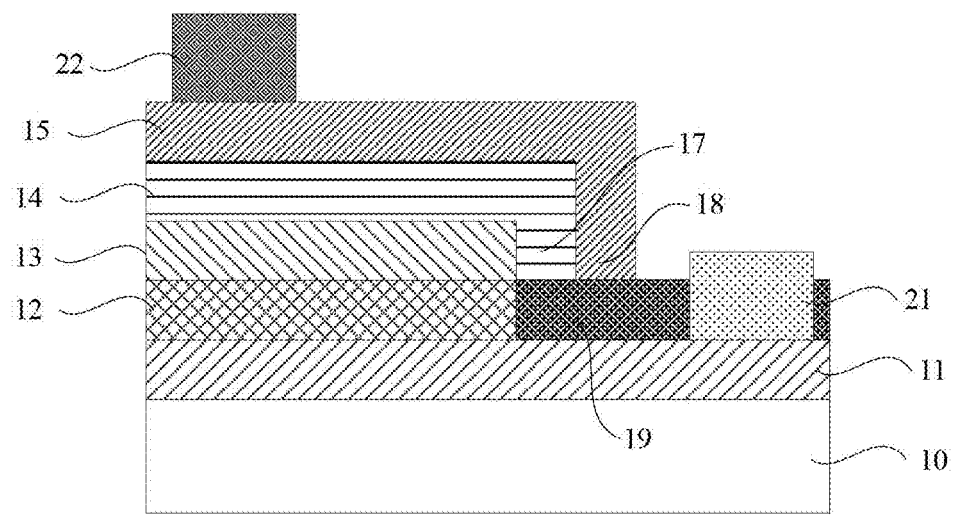
FIG. 8 is a cross-sectional structure schematic diagram of a semiconductor structure according to an embodiment of the present disclosure.

FIG. 8 is a cross-sectional structure schematic diagram of a semiconductor structure according to an embodiment of the present disclosure. Compared with the semiconductor structure shown in FIG. 5, the semiconductor structure shown in FIG. 8 also includes an N electrode 21 located on the n-type semiconductor layer 11 and a P electrode 22 located on the first heavily doped n-type semiconductor layer 15. The materials of N electrode 21 and P electrode 22 can be at least one of Ti, Al, Ni, Au. For example, N electrode 21 and P electrode 22 have a Ti/Al/Ni/Au multi-layer structure, or a Ti/Al multi-layer structure, or a Ni/Au multi-layer structure, which can be formed by sputtering. In some embodiments, a passivation layer is formed on the first heavily doped n-type semiconductor layer 15 to protect the semiconductor structure (not shown in figures).

Figure 9:
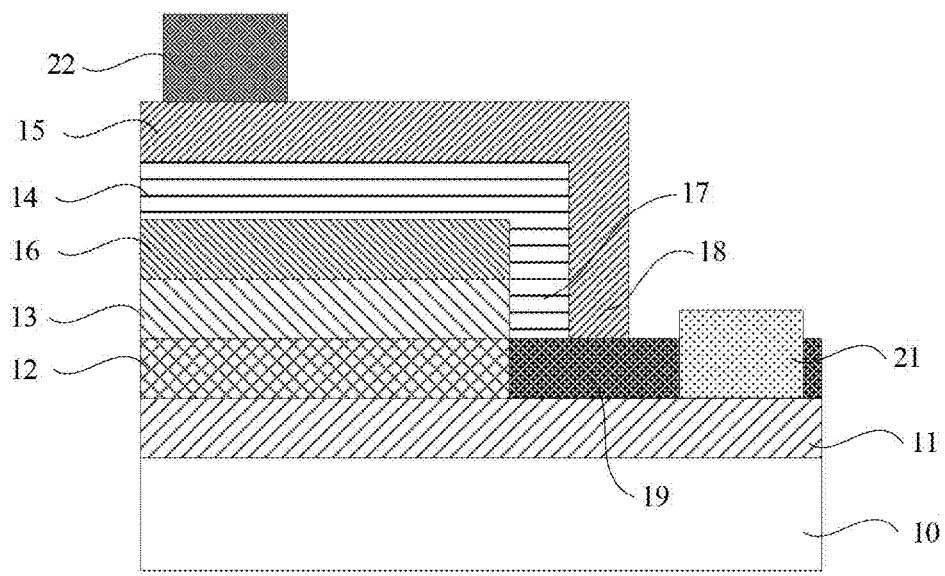
FIG. 9 is a cross-sectional structure schematic diagram of a semiconductor structure according to an embodiment of the present disclosure.

FIG. 9 is a cross-sectional structure schematic diagram of a semiconductor structure according to an embodiment of the present disclosure. Compared with the semiconductor structure shown in FIG. 8, the semiconductor structure shown in FIG. 9 further includes a heavily doped p-type semiconductor layer 16 located between the p-type semiconductor layer 13 and the first AlN layer 14. The doping concentration of heavily doped p-type semiconductor layer 16 is higher than that of p-type semiconductor layer 13. A higher hole concentration can reduce the contact resistance between a side of p-type semiconductor layer 13 and the metal electrode. In some embodiments, the doping concentration of the heavily doped p-type semiconductor layer 16 can be greater than or equal to $1E19/cm^3$.

Figure 10:
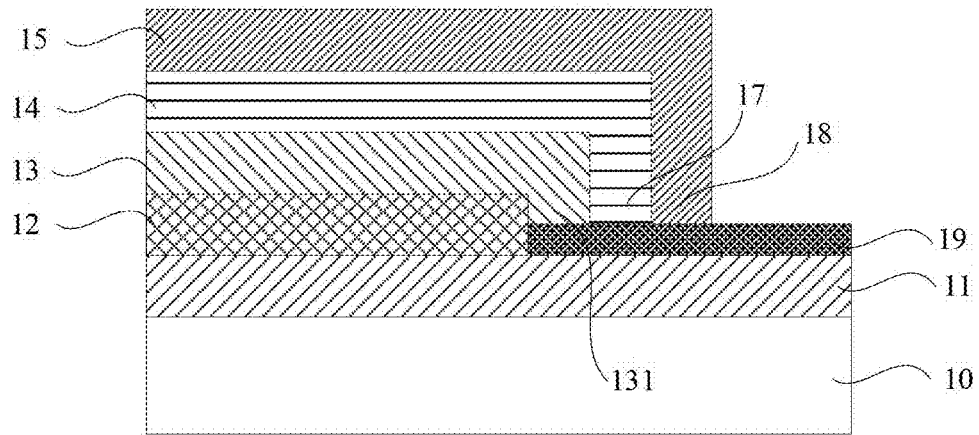
FIG. 10 is a cross-sectional structure schematic diagram of a semiconductor structure according to an embodiment of the present disclosure.

FIG. 10 is a cross-sectional structure schematic diagram of a semiconductor structure according to an embodiment of the present disclosure. Compared with the semiconductor structure shown in FIG. 5, the p-type semiconductor layer 13 includes a second p-type semiconductor layer 131, which is located on a side wall of the functional layer 12, covering at least a part of the side wall of the functional layer 12. The second AlN layer 17 and the second heavily doped n-type semiconductor layer 18 sequentially cover the second p-type semiconductor layer 131. Specifically, the second p-type semiconductor layer 131 covers the side wall of the functional layer 12. Therefore, more holes in the second p-type semiconductor layer 131 can be injected into the functional layer 12 through the side wall of the functional layer 12, especially into the quantum well layer of the functional layer 12, improving the recombination of electrons and holes in the functional layer 12 and improving semiconductor characteristics.

It should be noted that, as shown in FIGS. 5 and 7 to 10, the semiconductor structure is an LED for example, and only the front-mounted LED illustrates the corresponding embodiment, i.e., the N electrode and the P electrode are located on the same side of the semiconductor device. In some embodiments, the semiconductor device can be a vertical structure with a N electrode and a P electrode located on two sides of the semiconductor device separately.

In the embodiment of the present disclosure, after obtaining the semiconductor structure shown in FIGS. 1, 4, 5, and 7 to 10, the substrate 10 can be removed. The substrate 10 can be removed by laser peeling or chemical etching. The substrate 10 can also be kept in the semiconductor structure without removing it.

It should be noted that the dimensions and proportions of the individual structures in the accompanying drawings of this present disclosure do not represent the dimensions and proportions of the actual structures, but are used only to illustrate the relative position of the individual structures.

The above are only some embodiments of this present disclosure and are not intended to limit it. Any modifications, equivalent replacements, improvements, etc. made within the spirit and principles of this present disclosure shall be included within the scope of protection of this present disclosure.

What is claimed is:

1. A semiconductor structure, comprising:
    an n-type semiconductor layer, a functional layer, and a p-type semiconductor layer arranged in sequence;
    a first AlN layer, located on a side of the p-type semiconductor layer away from the functional layer;
    a first heavily doped n-type semiconductor layer, located on a side of the first AlN layer away from the p-type semiconductor layer.

2. The semiconductor structure according to claim 1, wherein the semiconductor structure is a light-emitting device, and the functional layer comprises an active layer; or the semiconductor structure is a PIN diode and the functional layer is an intrinsic layer.

3. The semiconductor structure according to claim 1, wherein a thickness of the first AlN layer is less than or equal to 5 nm in a direction from the n-type semiconductor layer pointing towards the functional layer.

4. The semiconductor structure according to claim 1, wherein a material of the first AlN layer is in an undoped, n-type doped, or p-type doped state.

5. The semiconductor structure according to claim 1, wherein the first AlN layer is doped with any one of scandium, indium, or aluminum.

6. The semiconductor structure according to claim 1, further comprising:
    a heavily doped p-type semiconductor layer, wherein the heavily doped p-type semiconductor layer is located between the p-type semiconductor layer and the first AlN layer, and a doping concentration of the heavily doped p-type semiconductor layer is higher than a doping concentration of the p-type semiconductor layer.

7. The semiconductor structure according to claim 6, wherein a doping concentration of the heavily doped p-type semiconductor layer is greater than or equal to $1E19/cm^3$.

8. The semiconductor structure according to claim 1, wherein a side wall of the p-type semiconductor layer is sequentially covered with a second AlN layer and a second heavily doped n-type semiconductor layer.

9. The semiconductor structure according to claim 8, wherein a thickness of the second AlN layer is less than or equal to 5 nm in a direction parallel to a plane in which the functional layer is located.

10. The semiconductor structure according to claim 1, wherein a material of the first heavily doped n-type semiconductor layer comprises an element In.

11. The semiconductor structure according to claim 1, wherein the p-type semiconductor layer comprises a second p-type semiconductor layer, wherein the second p-type semiconductor layer is located on a sidewall of the functional layer.

12. The semiconductor structure according to claim 1, wherein a doping concentration of the first heavily doped n-type semiconductor layer is greater than or equal to $1E18/cm^3$.

13. A method of manufacturing a semiconductor substrate, comprising:
   forming an n-type semiconductor layer;
   forming a functional layer on a side of the n-type semiconductor layer;
   forming a p-type semiconductor layer on a side of the functional layer away from the n-type semiconductor layer;
   forming a first AlN layer on a side of the p-type semiconductor layer away from the functional layer;
   forming a first heavily doped n-type semiconductor layer on a side of the first AlN layer away from the p-type semiconductor layer.

14. The method according to claim 13, wherein after forming the p-type semiconductor layer on the side of the functional layer away from the n-type semiconductor layer, the method further comprises:
   removing a part of the p-type semiconductor layer and a part the functional layer to make the side walls of the p-type semiconductor layer and the functional layer at a same line;
   forming the first AlN layer on a side of the p-type semiconductor layer away from the functional layer, and forming a second AlN layer on a side wall of the p-type semiconductor layer, wherein the first AlN layer and the second AlN layer are formed simultaneously;
   forming the first heavily doped n-type semiconductor layer on a side of the first AlN layer away from the p-type semiconductor layer, and forming a second heavily doped n-type semiconductor layer on a side of the second AlN layer away from the functional layer, wherein the first heavily doped n-type semiconductor layer and the second heavily doped n-type semiconductor layer are formed simultaneously.

\* \* \* \* \*